(12) United States Patent
Kazama et al.

(10) Patent No.: US 7,896,479 B2
(45) Date of Patent: Mar. 1, 2011

(54) LIQUID JET HEAD AND A PIEZOELECTRIC ELEMENT

(75) Inventors: Hironobu Kazama, Matsumoto (JP); Yuka Yonekura, Chino (JP); Koji Sumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 124 days.

(21) Appl. No.: 12/433,177

(22) Filed: Apr. 30, 2009

(65) Prior Publication Data
US 2009/0273651 A1  Nov. 5, 2009

(30) Foreign Application Priority Data

Apr. 30, 2008 (JP) ............................. 2008-119196
Apr. 30, 2009 (JP) ............................. 2009-110584

(51) Int. Cl.
*B41J 2/045* (2006.01)
(52) U.S. Cl. ...................................................... 347/68
(58) Field of Classification Search .................. 347/68, 347/69–72; 400/124.14, 124.16; 310/311, 310/324, 327, 358, 365; 427/100; 204/192.18; 430/319
See application file for complete search history.

(56) References Cited

U.S. PATENT DOCUMENTS

| 6,103,072 A * | 8/2000 | Nishiwaki et al. ...... 204/192.18 |
| 6,284,434 B1 * | 9/2001 | Kamei et al. ................. 430/319 |
| 2006/0146097 A1 * | 7/2006 | Fujii et al. ..................... 347/68 |

FOREIGN PATENT DOCUMENTS

JP  2006-278835  10/2006

* cited by examiner

*Primary Examiner*—K. Feggins
(74) *Attorney, Agent, or Firm*—Workman Nydegger

(57) ABSTRACT

A liquid jet head has a channel-forming substrate composed of a crystal substrate having a pressure-generating chamber linked to a nozzle opening as well as a piezoelectric element composed of a lower electrode, a piezoelectric layer, and an upper electrode and formed on the channel-forming substrate so that the pressure in the pressure-generating chamber can be changed, with the piezoelectric layer having a thickness equal to or smaller than 5 μm, made of a perovskite-type crystal, and formed so that the interval between the X-ray diffraction peak position derived from the (220) plane of the channel-forming substrate and the X-ray diffraction peak position derived from the (111) plane of the piezoelectric layer falls within the range $2\theta = 9.059 \pm 0.1°$.

4 Claims, 3 Drawing Sheets

LIQUID JET HEAD AND A PIEZOELECTRIC ELEMENT

BACKGROUND OF THE INVENTION

1. Field of the Invention

The present invention relates to a liquid jet head equipped with a piezoelectric element consisting of a lower electrode, a piezoelectric layer, and an upper electrode as well as a piezoelectric element.

2. Description of Related Arts

A piezoelectric element used in a liquid jet head or the like is an element composed of a piezoelectric film made of a piezoelectric material having an electromechanical conversion function sandwiched between two electrodes. The piezoelectric film is composed of, for example, crystallized piezoelectric ceramics.

Liquid jet heads having such a piezoelectric element include, for example, an ink jet recording head in which a portion of a pressure-generating chamber linked to a nozzle opening for discharging ink droplets is composed of a diaphragm, wherein the diaphragm is deformed by the piezoelectric element, thereby pressurizing ink contained in the pressure-generating chamber so that ink droplets can be discharged from the nozzle opening. Two kinds of ink jet recording heads have been put to practical use: ones based on a longitudinal-vibration-mode actuator that extends/retracts along the axial direction of a piezoelectric element and ones based on a flexural-mode actuator. For high density arrangement, such an actuator needs a piezoelectric element that offers a great strain even with a low driving voltage, in other words, a piezoelectric element that generates a marked displacement.

Also, ones having a piezoelectric layer whose X-ray diffraction peak position is specified in order that the displacement property of the piezoelectric layer is improved are proposed in, for example, Japanese Unexamined Patent Application Publication No. 2006-278835.

However, even when such a highly dielectric film was used to form a piezoelectric element, the obtained piezoelectric properties were unsatisfactory. Note that this problem is not limited to ink jet recording heads and other liquid jet heads and is noted also in other actuator apparatuses.

SUMMARY OF THE INVENTION

An advantage of some aspects of the present invention is that at least some part of the problem described above is solved. The present invention can be implemented in the following embodiments or examples.

A liquid jet head is equipped with a channel-forming substrate composed of a crystal substrate having a pressure-generating chamber linked to a nozzle opening as well as a piezoelectric element composed of a lower electrode, a piezoelectric layer, and an upper electrode and formed on the channel-forming substrate so that the pressure in the pressure-generating chamber can be changed, wherein the piezoelectric layer has a thickness equal to or smaller than 5 μm, is made of a perovskite-type crystal, and is formed so that the interval between the X-ray diffraction peak position derived from the (220) plane of the channel-forming substrate and that derived from the (111) plane of the piezoelectric layer falls within the range $2\theta=9.059\pm0.1°$.

Other features and objects of the present invention will be clarified when the information described in this description is read with reference to the accompanying drawings.

BRIEF DESCRIPTION OF THE DRAWINGS

To understand the present invention and its advantages completely, refer to the following description and the accompanying drawings.

DETAILED DESCRIPTION OF PREFERRED EMBODIMENTS

Figure 1:
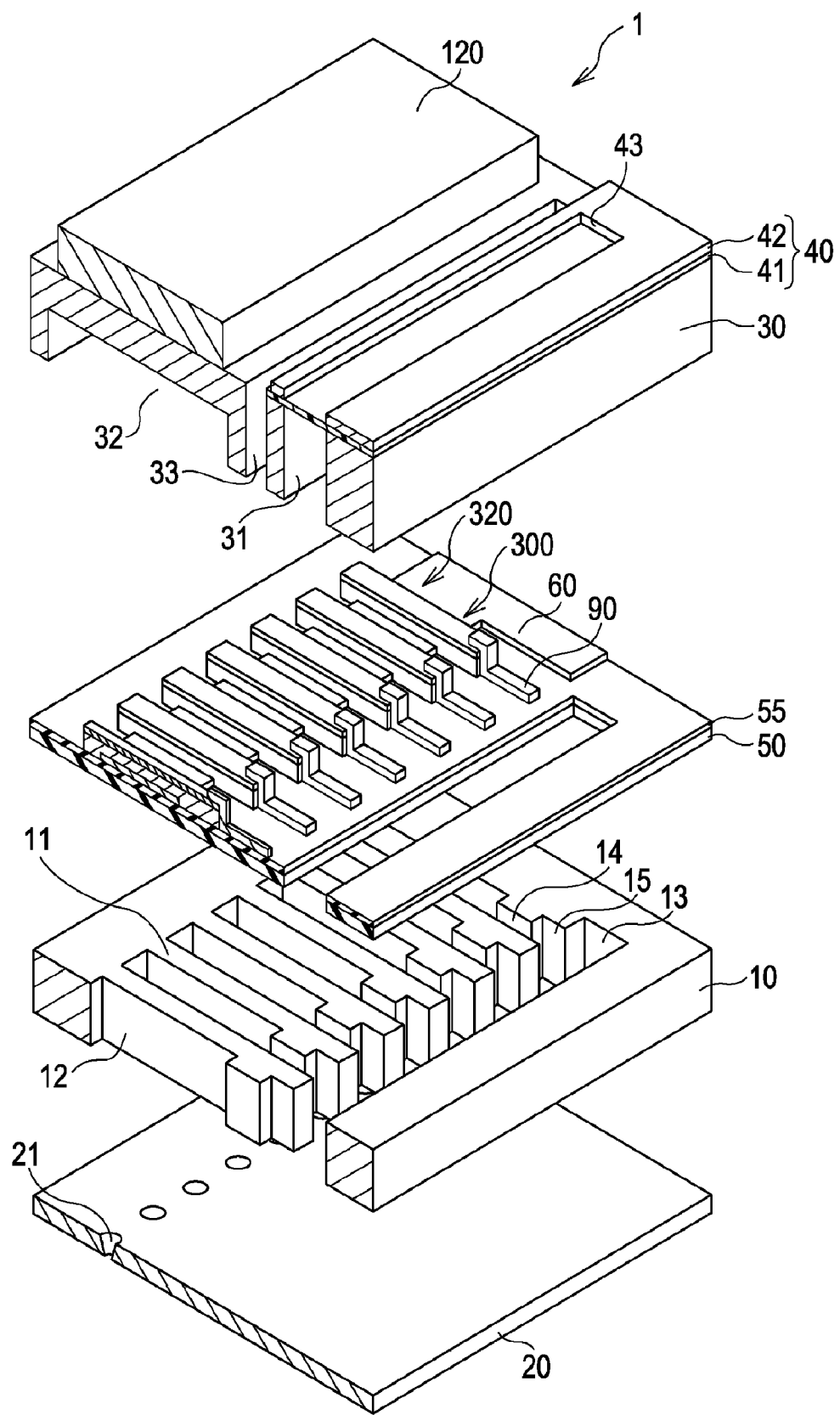
FIG. 1 is an exploded perspective view of a recording head according to Embodiment 1 of the present invention.

The information described in this description and those shown in the accompanying drawings clarify at least the following.

A liquid jet head is equipped with a channel-forming substrate composed of a crystal substrate having a pressure-generating chamber linked to a nozzle opening as well as a piezoelectric element composed of a lower electrode, a piezoelectric layer, and an upper electrode and formed on the channel-forming substrate so that the pressure in the pressure-generating chamber can be changed, wherein the piezoelectric layer has a thickness equal to or smaller than 5 μm, is made of a perovskite-type crystal, and is formed so that the interval between the X-ray diffraction peak position derived from the (220) plane of the channel-forming substrate and that derived from the (111) plane of the piezoelectric layer falls within the range $2\theta=9.059\pm0.1°$.

In this embodiment, the piezoelectric layer has predetermined crystallinity, so that a great displacement can be generated even with a low driving voltage and, for example, that the piezoelectric properties of the piezoelectric layer are improved; for example, durability and decreases in degree of displacement caused by partial time-course fixation of the direction of polarization due to delamination and repeated rotation and extension/retraction of polarization during driving, namely, a so-called fatigue phenomenon, are improved. Therefore, this embodiment enables the production of a liquid jet head having excellent liquid jet properties.

The full width at half maximum of the X-ray diffraction peak derived from the (111) plane of the piezoelectric layer described above is preferably equal to or smaller than 0.3°. When this condition is fulfilled, variation in the composition ratio along the thickness direction of the piezoelectric layer, in other words, variation in crystal lattice, is reduced, and thus excellent piezoelectric properties can be obtained.

The lower electrode is preferably made of a material mainly composed of platinum, and the interval between the X-ray diffraction peak position derived from the (111) plane of the lower electrode and that derived from the (220) plane of the channel-forming substrate described above preferably falls within the range $2\theta=7.411\pm0.1°$. When these conditions are fulfilled, the stress applied to the lower electrode falls within a certain range, and thus a piezoelectric layer is formed on the lower electrode with excellent crystallinity.

A piezoelectric element is equipped with a lower electrode formed on a crystal substrate, a piezoelectric layer having a thickness equal to or smaller than 5 μm and composed of a perovskite-type crystal, and an upper electrode, wherein the piezoelectric layer is formed so that the interval between the X-ray diffraction peak position derived from the (220) plane of the channel-forming substrate and that derived from the (111) plane of the piezoelectric layer falls within the range $2\theta=9.059\pm0.1°$.

In this embodiment, the piezoelectric properties of the piezoelectric layer can be improved; for example, durability and decreases in degree of displacement caused by partial time-course fixation of the direction of polarization due to delamination and repeated rotation and extension/retraction of polarization during driving, namely, a so-called fatigue phenomenon, can be improved.

Best Embodiments

Hereinafter, some embodiments of the present invention are detailed with reference to drawings.

Embodiment 1

Figure 2:
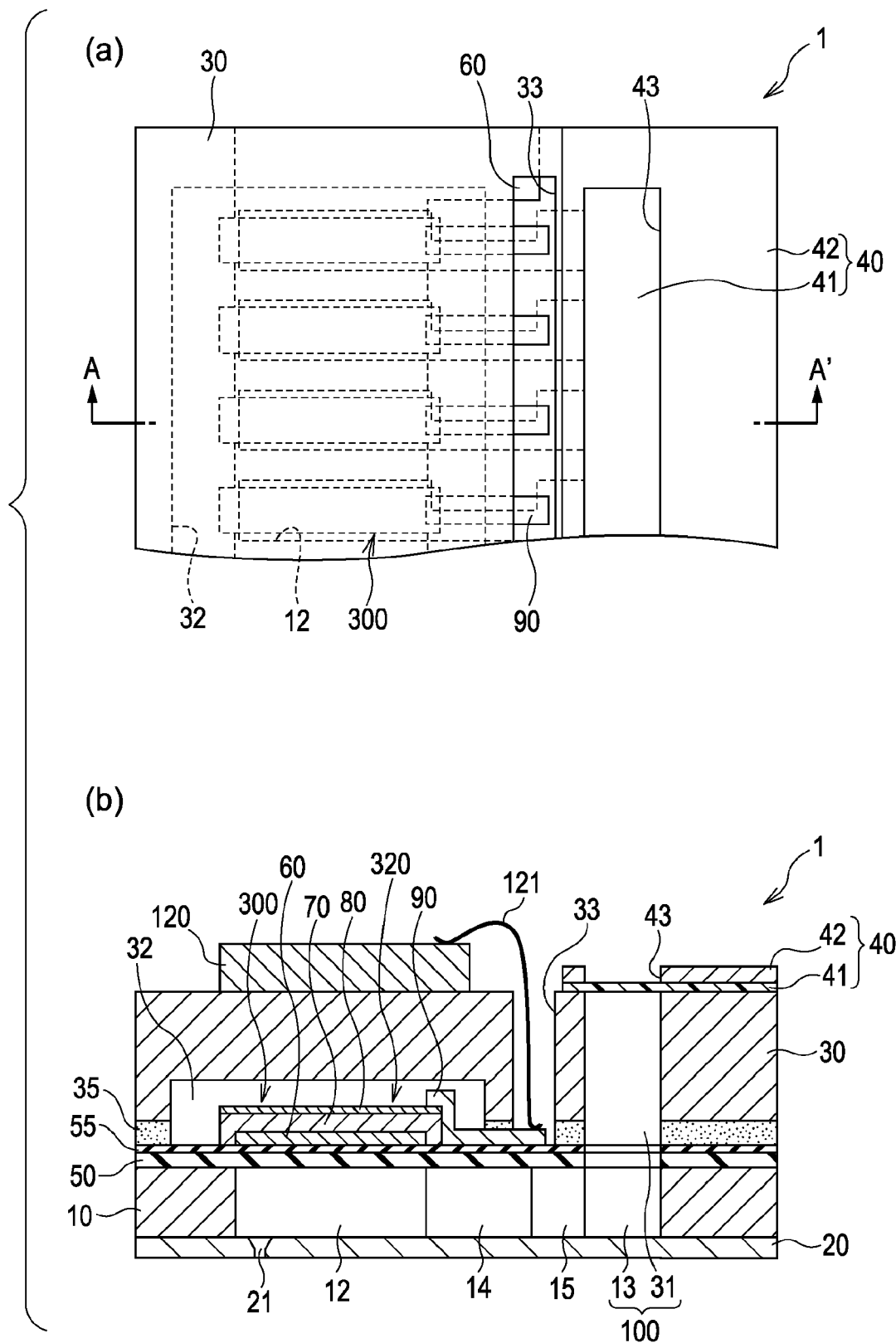
FIG. 2 includes a plan view and a cross-sectional view of a recording head according to Embodiment 1 of the present invention.

FIG. 1 is an exploded perspective view showing a simplified configuration of an ink jet recording head, which is an example of liquid jet heads according to this embodiment. FIG. 2(a) is a plan view of FIG. 1, and FIG. 2(b) is a cross-sectional diagram taken along line A-A' of FIG. 2(a).

The channel-forming substrate 10 used in this embodiment is composed of a silicon single-crystal substrate whose crystal plane orientation is (110). The channel-forming substrate 10 has a silicon dioxide elastic film 50 formed in advance by thermal oxidation on one side thereof, and the elastic film 50 is covered with an insulating film 55 made of zirconium oxide ($ZrO_2$) or the like.

The channel-forming substrate 10 has pressure-generating chambers 12 formed by anisotropic etching from the other side, arranged in the width direction (lateral direction) and divided by several partitions 11. An area located outside the pressure-generating chambers 12 has a linkage area 13 formed along the longitudinal direction, and the linkage area 13 and each of the pressure-generating chambers 12 are linked via an ink supply path 14 and a pathway 15. In other words, the channel-forming substrate 10 has a liquid channel consisting of the pressure-generating chambers 12, linkage area 13, ink supply paths 14, and pathways 15. The linkage area 13 is linked to a reservoir portion 31 formed on the protection substrate 30 described later, thereby acting as a portion of a reservoir 100; the reservoir 100 provides an ink chamber common for the pressure-generating chambers 12.

The opening side (the other side) of the channel-forming substrate 10 is fastened to a nozzle plate 20 via an adhesive agent, a hot-melt film, or the like; the nozzle plate 20 has nozzle openings 21 communicating with portions close to the ends of the pressure-generating chambers 12 opposite to the ink supply paths 14.

On the other hand, the side opposite to the opening side of the channel-forming substrate 10 has, as described above, an elastic film 50 formed thereon, and this elastic film 50 has an insulating film 55 formed thereon. On this insulating film 55, a laminate of a lower electrode film 60, a piezoelectric layer 70, and an upper electrode film 80 is formed by a film formation method or lithography, constituting piezoelectric elements 300. The term piezoelectric element 300 as used herein refers to a portion including a lower electrode film 60, a piezoelectric layer 70, and an upper electrode film 80. In general, one of the electrodes of each piezoelectric element 300 is used as a common electrode, whereas the remaining electrodes and the piezoelectric layer 70 are patterned to fit the pressure-generating chambers 12. The portion constituted by the patterned electrodes and the piezoelectric layer 70, which generates piezoelectric strain when voltage is applied to both electrodes, is referred to as a piezoelectric active portion 320. In this embodiment, the lower electrode film 60 serves as a common electrode for the piezoelectric element 300, whereas the upper electrode film 80 serves as separate electrodes for the piezoelectric element 300; however, their roles may be reversed without any problems if issues related to driving circuits or wiring necessitate it. The piezoelectric elements 300 and a diaphragm driven by the piezoelectric elements 300 are collectively referred to as an actuator apparatus. Note that the diaphragm used in the example described above includes the elastic film 50, insulating film 55, and lower electrode film 60, but is never limited to this example, of course. For example, the diaphragm may be constituted by the lower electrode 60 only, with no elastic film 50 or insulating film 55 included therein. Also, the piezoelectric elements 300 themselves may virtually act as the diaphragm.

Examples of the piezoelectric layer 70 used in this embodiment include a perovskite-structured crystal film (perovskite-type crystals) made of a highly dielectric ceramic material; this film is formed on the lower electrode film 60 and has an electromechanical conversion function. Materials suitably used to form the piezoelectric layer 70 include, for example, highly dielectric piezoelectric materials such as lead zirconate titanate (PZT) and ones obtained by adding niobium oxide, nickel oxide, magnesium oxide, or some other metal oxide to them. More specifically, lead titanate ($PbTiO_3$), lead zirconate titanate ($Pb(Zr, Ti)O_3$), lead zirconate ($PbZrO_3$), lead lanthanum zirconate (($Pb, La$), $TiO_3$), lead lanthanum zirconate titanate (($Pb, La$)($Zr, Ti$)$O_3$), lead zirconium titanate magnesium niobate ($Pb(Zr, Ti)(Mg, Nb)O_3$) or the like may be used. In this embodiment, lead zirconate titanate (PZT) is used as the piezoelectric layer 70. The thickness of the piezoelectric layer 70 is small enough to avoid the formation of cracks during the manufacturing process but large enough to have a sufficient displacement property. For example, the piezoelectric layer 70 used in this embodiment has a thickness equal to or smaller than 5 μm.

Figure 3:
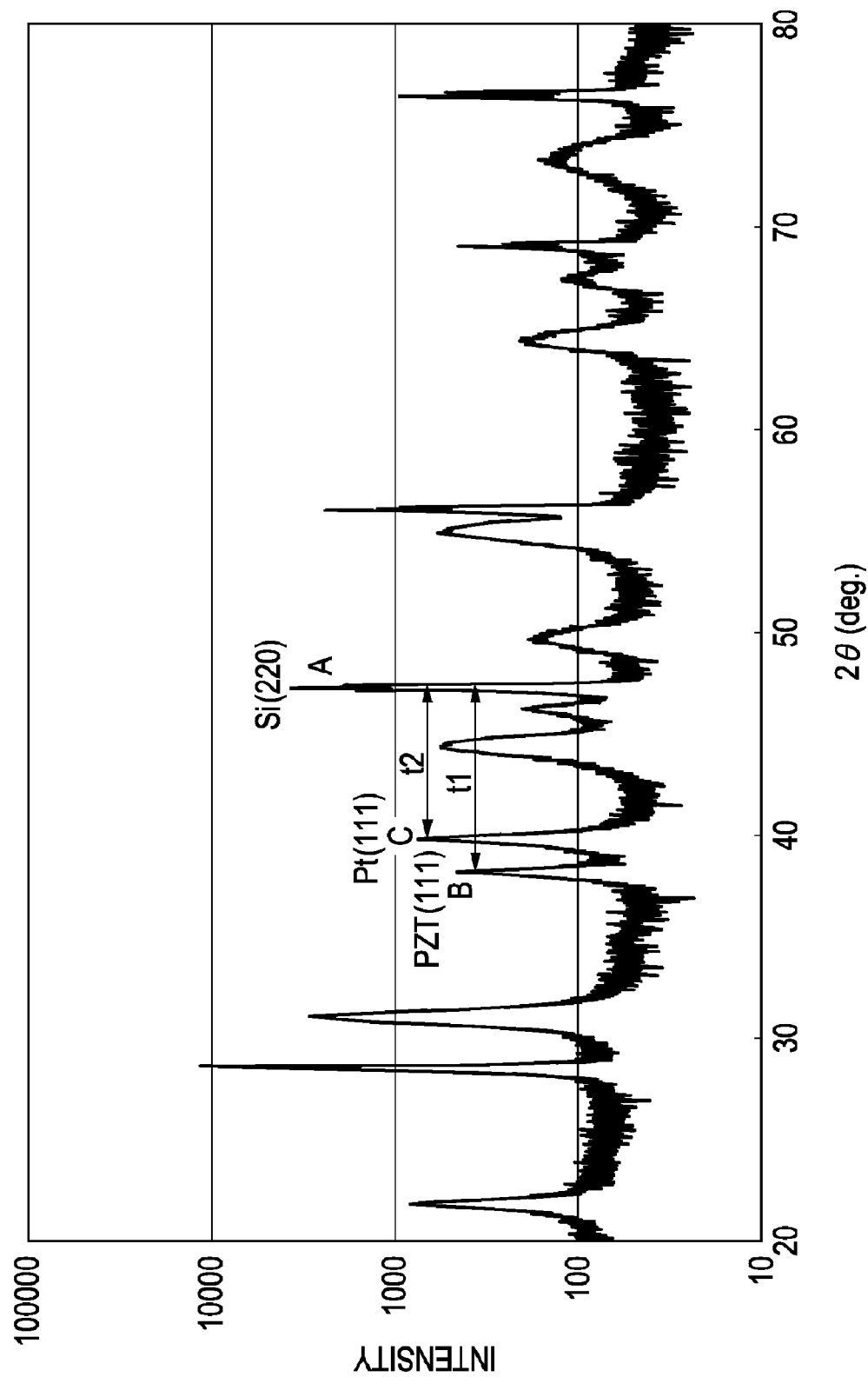
FIG. 3 is a graph showing measurements obtained in Embodiment 1 of the present invention.

As shown in FIG. 3, the piezoelectric layer 70 is formed so that the interval t1 between the X-ray diffraction peak position A derived from the (220) plane of the channel-forming substrate 10 and the X-ray diffraction peak position B derived from the (111) plane of the piezoelectric layer 70, measured by wide-angle X-ray diffractometry (XRD), falls within the range $2\theta=9.059\pm0.1°$. The X-ray diffraction peak position A derived from the (220) plane of the channel-forming substrate 10, although not shown in FIG. 3, can be determined by calculation, and the interval t1 between the diffraction peak position A of the (220) plane of the channel-forming substrate 10 and the diffraction peak position B of the (111) plane of the piezoelectric layer 70 can also be determined by calculation.

Under this configuration, in which the X-ray diffraction peak position B of the (111) plane of the piezoelectric layer 70 has a predetermined relationship with the diffraction peak position A of the (220) plane of the channel-forming substrate 10, the piezoelectric layer 70 can generate a great degree of displacement even with a low driving voltage, in other words, has an excellent displacement property, and the piezoelectric properties of the piezoelectric layer 70 are improved; for example, durability and decreases in the degree of displacement caused by partial time-course fixation of the direction of polarization due to delamination and repeated rotation and extension/retraction of polarization during driving, namely, a so-called fatigue phenomenon, are improved.

The full width at half maximum of the X-ray diffraction peak derived from the (111) plane of the piezoelectric layer 70 used in this embodiment, measured by wide-angle X-ray diffractometry (XRD), is equal to or smaller than 0.3°. When the piezoelectric layer 70 is analyzed by wide-angle X-ray diffractometry, diffraction intensity peaks corresponding to the (100) plane, (110) plane, (111) plane, and other planes appear. The term "full width at half maximum" means the width of the rocking curve corresponding to each of the crystal planes, shown in the X-ray diffractometry chart (FIG. 3) measured by wide-angle X-ray diffractometry, at half maximum of the peak intensity.

The full width at half maximum measured on the (111) plane represents displacements of crystal lattices in the thickness direction of the piezoelectric layer 70. The more uniform the size in the thickness direction of the crystal lattices existing in the piezoelectric layer 70 is, the better the piezoelectric properties of the piezoelectric layer 70 are. Thus, the full width at half maximum measured on the (111) plane, which represents displacements of the crystal lattices existing in the piezoelectric layer 70, is preferably as small as possible.

The full width at half maximum measured on the (111) plane of the piezoelectric layer 70 reduced to 0.3° or less in this way results in reduced variation in the composition ratio along the thickness direction of the piezoelectric layer 70, in other words, reduced variation in crystal lattice; as a result, excellent piezoelectric properties are obtained.

The lower electrode film 60 used in this embodiment is made of a material mainly composed of platinum (Pt) and is formed so that, as shown in FIG. 3, the interval between X-ray diffraction peak position C derived from the (111) plane of the lower electrode film 60 and the X-ray diffraction peak position A derived from the (220) plane of the channel-forming substrate falls within the range $2\theta=7.411\pm0.1°$.

The stress applied to the lower electrode film 60 can be adjusted by controlling the diffraction peak position C of the (111) plane of the lower electrode film 60 to fall within the predetermined range in this way; as a result, it becomes possible to form the piezoelectric layer 70 on the lower electrode film 60 with $2\theta$ and the full width at half maximum of the diffraction peak position of the (100) plane falling within the ranges described above. In other words, since the stress applied to the lower electrode film 60 influences the crystallinity of the piezoelectric layer 70 formed on the lower electrode film 60, the control of the stress applied to the lower electrode film 60 to fall within the predetermined range can result in the formation of the piezoelectric layer 70 with crystallinity excellent in piezoelectric properties.

The piezoelectric layer 70 can be formed by a sol-gel method, an MOD (Metal-Organic Decomposition) method, a PVD (Physical Vapor Deposition) method such as sputtering and laser ablation, or the like. The aforementioned crystal characteristics of the piezoelectric layer 70 can be achieved by adjusting the composition of sol, heat treatment temperature, and other factors concerning manufacturing.

Also, the piezoelectric layer 70 may be preferentially oriented in any of the (100) plane, (110) plane, and (111) plane, and the crystal structure of the piezoelectric layer 70 may be rhombohedral, tetragonal, or monoclinic. The piezoelectric layer 70 used in this embodiment is preferentially oriented in the (111) plane as shown in FIG. 3. Of course, a piezoelectric layer 70 that is preferentially oriented in the (100) plane or the (110) plane may be used instead. Note that such a piezoelectric layer 70, which is preferentially oriented in the (100) plane or the (110) plane, can be formed in the following ways: forming an orientation-controlling layer having a predetermined crystal orientation under or over the lower electrode film 60; or covering the lower electrode film 60 with titanium for masking the orientation of the lower electrode film 60 and then adjusting the heat treatment temperature and other factors used during the formation of the piezoelectric layer 70.

On the other hand, a piezoelectric layer 70 that is preferentially oriented in the (111) plane can be formed by, for example, forming it directly on a lower electrode film 60 that is preferentially oriented in the (111) plane. The formed piezoelectric layer 70 is preferentially oriented in the (111) plane as a result of epitaxial growth by which the crystallinity of the lower electrode film 60 is reflected in the formed piezoelectric layer 70.

Examples 1 to 3

As a base for the formation of a piezoelectric layer 70, a lower electrode film 60 was formed on a channel-forming substrate 10; this lower electrode film 60 was a laminate consisting of a close contact layer made of titanium (Ti), a platinum layer made of platinum (Pt) and formed on the close contact layer, and an iridium layer made of iridium (Ir) and formed on the platinum layer. Then, a piezoelectric layer 70 was formed on the lower electrode film 60 by a sol-gel method. More specifically, the method used to form the piezoelectric layer 70 was application of sol (application solution) containing an organic material of the piezoelectric layer 70 to the surface of the channel-forming substrate 10 facing the lower electrode film 60. In Examples 1 to 3, the sol (application solution) was applied by spin coating and then, after the completion of application, allowed to rotate for 30 to 60 seconds so that the film thickness of the sol could reach a constant. Subsequently, the applied application solution was heated to a predetermined temperature and dried for a predetermined time period; as a result, a piezoelectric precursory film was formed. Examples 1 to 3 included two drying steps: in the first drying step, the application solution was heated and dried at 100±10° C. for 3 minutes; in the second drying step, the dried product was heated and further dried at 160±10° C. for 3 minutes. Then, the dried piezoelectric precursory film was degreased by heating at a predetermined temperature for a predetermined time period (degreasing step). In this embodiment, the dried piezoelectric precursory film was degreased by heating at 380±15° C. for 3 minutes. Note that the term "degrease" as used herein means to remove organic components contained in the piezoelectric precursory film in the form of $NO_2$, $CO_2$, $H_2O$, or the like, or to form a piezoelectric precursory film to an extent that the film never crystallizes, in other words, to form an amorphous piezoelectric precursory film. In the next step, the degreased piezoelectric precursory film was allowed to crystallize by heating at a predetermined temperature for a predetermined time period; as a result, the piezoelectric layer 70 was formed (baking step). In this embodiment, the degreased piezoelectric precursory film was baked by heating at 737±30° C. for 5 minutes, so that the piezoelectric layer 70 was formed. Three piezoelectric layers 70 were produced under these production conditions; they were named Examples 1 to 3. In Examples 1 to 3, the piezoelectric layers 70 had an upper electrode film 80 formed thereon, and the channel-forming substrate 10 had pressure-generating chambers 12 and other necessary components.

Comparative Examples 1 and 2

Two piezoelectric layers were produced under production conditions at least partially different from those used in Examples 1 to 3; they were named Comparative Examples 1 and 2.

(Experiment 1)

The piezoelectric layers produced as Examples 1 to 3 and Comparative Examples 1 and 2 were analyzed by wide-angle X-ray diffractometry (XRD). The wide-angle X-ray diffractometry conditions used in this embodiment were as follows: X-ray diffractometer: GXR300 manufactured by Rigaku Corporation; light source: Cu-Kα; dominant wavelength: 1.541838 Å; scan speed: 2°/min; increment of θ during scanning (resolution): 0.02°. The results are shown in Table 1 below.

Also, the piezoelectric elements produced in Examples 1 to 3 and Comparative Examples 1 and 2 were evaluated for the degree of displacement in the initial stage of driving (initial displacement) and that reached after repeated driving cycles (decreased displacement), and the initial displacement and the decreased displacement were compared for the examples and comparative examples. The results are shown in Table 1 below.

TABLE 1

|  | t1 (111)-(220) | Initial displacement | Decrease in displacement (fatigue) | Result |
| --- | --- | --- | --- | --- |
| Comparative Example 1 | 9.039 | △ | ○ | △ |
| Example 1 | 9.049 | ○ | ○ | ○ |
| Example 2 | 9.059 | ○ | ○ | ○ |
| Example 3 | 9.069 | ○ | ○ | ○ |
| Comparative Example 2 | 9.077 | ○ | △ | △ |

As shown in Table 1, Examples 1 to 3, in which the interval t1 between the X-ray diffraction peak position A derived from the (220) plane of the channel-forming substrate 10 and the X-ray diffraction peak position B derived from the (111) plane of the piezoelectric layer 70 falls within the range 2θ=9.059±0.1°, were better in terms of the degree of displacement in the initial stage of driving and experienced a smaller decrease in displacement during repeated driving cycles (fatigue). On the other hand, Comparative Example 1, in which the interval t1 was smaller than 2θ=9.049°, showed a smaller initial displacement, and Comparative Example 2, in which the interval t1 was greater than 2θ=9.069°, experienced a greater decrease in displacement.

This means that, as described above, piezoelectric elements 300 equipped with a piezoelectric layer 70 formed so that the interval t1 between the X-ray diffraction peak position A derived from the (220) plane of the channel-forming substrate 10 and the X-ray diffraction peak position B derived from the (111) plane of the piezoelectric layer 70 falls within the range 2θ=9.059±0.1° are excellent in terms of initial displacement and experience smaller decreases in displacement.

Additionally, each of the upper electrode films 80, which provide separate electrodes of the piezoelectric elements 300, is connected to a lead electrode 90 made of gold (Au) or the like; the lead electrodes 90 extend from the vicinity of the end closer to the ink supply paths 14 to the insulating film 55.

The channel-forming substrate 10 having such piezoelectric elements 300 formed thereon, more specifically, the lower electrode film 60, insulating film 55, and lead electrodes 90, is joined via an adhesive agent 35 to a protection substrate 30 having a reservoir portion 31 acting as at least a portion of a reservoir 100. In this embodiment, the reservoir portion 31 is formed along the width direction of the pressure-generating chambers 12 so as to pass through the protection substrate 30 in the thickness direction, thereby acting as a portion of the aforementioned reservoir 100, which is linked to the linkage area 13 of the channel-forming substrate 10 and provides an ink chamber common for the pressure-generating chambers 12. The linkage area 13 of the channel-forming substrate 10 may be divided into several compartments corresponding to the pressure-generating chambers 12 so that only the reservoir portion 31 can act as the reservoir. It is also acceptable that, for example, the channel-forming substrate 10 has the pressure-generating chambers 12 only, while the ink supply paths 14 for linking the reservoir to the pressure-generating chambers 12 are formed on members lying between the channel-forming substrate 10 and the protection substrate 30 (e.g., the elastic film 50, the insulating film 55, and so forth).

The protection substrate 30 has a piezoelectric-element-retaining portion 32 in the area facing the piezoelectric elements 300; the piezoelectric-element-retaining portion 32 has a space large enough to allow the piezoelectric elements 300 to move freely. The only requirement of the piezoelectric-element-retaining portion 32 is a large space enough to allow the piezoelectric elements 300 to move freely, and the space may be sealed or not.

The protection substrate 30 further has a through hole 33 formed through the protection substrate 30 along the thickness direction. The vicinity of the end of each of the lead electrodes 90, extending from each of the piezoelectric elements 300, is exposed inside the through hole 33.

The protection substrate 30 further has a driving circuit 120 fastened thereto, and this driving circuit 120 functions as a signal processor. Examples of the driving circuit 120 include a circuit substrate, a semiconductor integrated circuit (IC), and so forth. The driving circuit 120 and the lead electrodes 90 are electrically connected to each other via connecting wires 121 inserted into the through hole 33, and the connecting wires 121 are each composed of a conductive wire such as a bonding wire.

The material of the protection substrate 30 is preferably one having a coefficient of thermal expansion almost equivalent to that of the channel-forming substrate 10, for example, a glass material or a ceramic material. In this embodiment, a silicon single-crystal substrate whose crystal plane orientation is (110) is used, which is used also as the channel-forming substrate 10.

The protection substrate 30 further has a compliance substrate 40 joined thereto, and the compliance substrate 40 has a sealing film 41 and a stationary plate 42. The sealing film 41 is made of a low-rigidity and flexible material, such as a polyphenylene sulfide (PPS) film, sealing one side of the reservoir portion 31. On the other hand, the stationary plate 42 is made of a metal or some other hard material, such as stainless used steel (SUS). The portion of the stationary plate 42 facing the reservoir 100 is completely void along the thickness direction, thereby providing an opening 43. This means that the aforementioned side of the reservoir 100 is sealed only with the flexible sealing film 41.

An ink jet recording head 1 according to this embodiment discharges ink droplets in the following way: ink is loaded via an ink injection port connected to an external ink supply means not shown in the drawing; the inside of the members ranging from the reservoir 100 to the nozzle openings 21 is filled with the ink; voltage is applied between the lower electrode films 60 and the upper electrode films 80 corresponding to the pressure-generating chambers 12 in accordance with a recording signal sent by the driving circuit 120 so that the elastic film 50, insulating film 55, lower electrode films 60, and piezoelectric layer 70 are deformed by flexure; and then the internal pressure of the pressure-generating chambers 12 rises by the deformation; as a result, ink droplets are discharged from the nozzle openings 21.

In this embodiment, therefore, the ink jet recording head 1 has piezoelectric elements 300 each having a piezoelectric layer 70 with an excellent displacement property and thus has improved ink discharge properties, such as ink discharge speed and the weight of ink droplets, even when the driving voltage is low.

Other Embodiments

The foregoing is an explanation of an embodiment of the present invention; however, the basic configuration of the present invention is never limited to the embodiment described above. For example, Embodiment 1 described above exemplifies an ink jet recording head having a lower electrode film 60 mainly composed of platinum (Pt), but the material of the lower electrode film 60 is not particularly limited to platinum; for example, the lower electrode layer 60 may have a close contact layer made of a material other than platinum, which is formed under the insulating film 55 as the lowermost layer. Furthermore, an anti-diffusion layer may be formed in order to prevent components of the lower electrode film 60 from diffusing into the piezoelectric layer 70 and to prevent components of the piezoelectric layer 70 from diffusing into the lower electrode film 60. Examples of the material of the close contact layer include titanium (Ti), zirconium (Zr) tantalum (Ta), tungsten (W), nickel (Ni), hafnium (Hf) niobium (Nb), molybdenum (Mo), and cobalt (Co). Examples of the material of the anti-diffusion layer include iridium (Ir), palladium (Pb), rhodium (Rh), ruthenium (Ru), osmium (Os), and oxides of them.

Although Embodiment 1 described above exemplifies an ink jet recording head as an example of liquid jet heads, the present invention covers all kinds of liquid jet heads and thus is applicable to liquid jet heads for discharging liquid other than ink, of course. Examples of such liquid jet heads include recording heads for printers or other image recording apparatuses, jet heads for color materials used to manufacture color filters for liquid crystal displays or the like, jet heads for electrode materials used to form electrodes for organic EL displays and FEDs (field emission displays), jet heads for biological organic matter used to manufacture biochips, and so forth.

In addition, the present invention is applicable not only to piezoelectric elements for ink jet recording heads and other liquid jet heads but also to piezoelectric elements for other apparatuses.

The invention claimed is:

1. A liquid jet head comprising:
a channel-forming substrate composed of a crystal substrate having a pressure-generating chamber linked to a nozzle opening; and
a piezoelectric element composed of a lower electrode, a piezoelectric layer, and an upper electrode and formed on the channel-forming substrate so that the pressure in the pressure-generating chamber can be changed, wherein:
the piezoelectric layer has a thickness equal to or smaller than 5 μm, is made of a perovskite-type crystal, and is formed so that the interval between the X-ray diffraction peak position derived from the (220) plane of the channel-forming substrate and the X-ray diffraction peak position derived from the (111) plane of the piezoelectric layer falls within the range $2\theta=9.059\pm0.1°$.

2. The liquid jet head according to claim 1, wherein:
the full width at half maximum of the X-ray diffraction peak derived from the (111) plane of the piezoelectric layer is equal to or smaller than 0.3°.

3. The liquid jet head according to claim 1, wherein:
the lower electrode is made of a material mainly composed of platinum, and the interval between the X-ray diffraction peak position derived from the (111) plane of the lower electrode and the X-ray diffraction peak position derived from the (220) plane of the channel-forming substrate falls within the range $2\theta=7.411\pm0.1°$.

4. A piezoelectric element comprising:
a lower electrode formed on a crystal substrate, a piezoelectric layer having a thickness equal to or smaller than 5 μm and made of a perovskite-type crystal, and an upper electrode, wherein:
the piezoelectric layer is formed so that the interval between the X-ray diffraction peak position derived from the (220) plane of the crystal substrate and the X-ray diffraction peak position derived from the (111) plane of the piezoelectric layer falls within the range $2\theta=9.059\pm0.1°$.

* * * * *